United States Patent
Juang et al.

(10) Patent No.: US 11,246,238 B2
(45) Date of Patent: Feb. 8, 2022

(54) HEAT CONDUCTIVE DEVICE AND ELECTRONIC DEVICE

(71) Applicants: SULFURSCIENCE TECHNOLOGY CO., LTD., New Taipei (TW); MING CHI UNIVERSITY OF TECHNOLOGY, New Taipei (TW)

(72) Inventors: Zhen-Yu Juang, Taipei (TW); Sung-Yen Wei, Zhubei (TW); Chia-Chin Cheng, Taipei (TW); Chien-Kuo Hsieh, New Taipei (TW)

(73) Assignees: SULFURSCIENCE TECHNOLOGY CO., LTD., New Taipei (TW); MING CHI UNIVERSITY OF TECHNOLOGY, New Taipei (TW)

( * ) Notice: Subject to any disclaimer, the term of this patent is extended or adjusted under 35 U.S.C. 154(b) by 0 days.

(21) Appl. No.: 16/887,534

(22) Filed: May 29, 2020

(65) Prior Publication Data

US 2021/0251106 A1    Aug. 12, 2021

(51) Int. Cl.
*H05K 7/20* (2006.01)

(52) U.S. Cl.
CPC ....... *H05K 7/20336* (2013.01); *H05K 7/2039* (2013.01)

(58) Field of Classification Search
CPC .......... H05K 7/20336; H05K 7/20809; H05K 1/0203; H05K 7/2039; H05K 7/20936; H05K 7/2099; G06F 1/203; G06F 1/20; F28F 21/08; F28F 21/085; F24F 2012/005
See application file for complete search history.

(56) References Cited

U.S. PATENT DOCUMENTS

| | | | | |
|---|---|---|---|---|
| 8,353,334 | B2 * | 1/2013 | Zhao | F28D 15/046 165/104.26 |
| 2005/0269065 | A1 * | 12/2005 | Chen | F28F 19/02 165/104.26 |
| 2007/0284089 | A1 * | 12/2007 | Vadakkanmaruveedu | F28D 15/0233 165/104.26 |
| 2008/0174963 | A1 * | 7/2008 | Chang | F28D 15/046 361/700 |
| 2010/0006368 | A1 * | 1/2010 | Jones | G10K 11/172 181/213 |
| 2010/0294475 | A1 * | 11/2010 | Rush | F28D 15/046 165/185 |
| 2011/0042040 | A1 * | 2/2011 | Tantolin | F28D 15/06 165/104.16 |
| 2011/0127013 | A1 * | 6/2011 | Kawamura | C25D 15/02 165/104.26 |

(Continued)

*Primary Examiner* — Adam B Dravininkas
(74) *Attorney, Agent, or Firm* — Muncy, Geissler, Olds & Lowe, P.C.

(57) ABSTRACT

A heat conductive device includes a heat conductive unit, a wick structure, a heat transferring unit, and a heat conductive fluid. The heat conductive unit has a closed chamber. The wick structure is disposed on the inner side surface of the closed chamber. The heat transferring unit includes a plurality of heat conductive elements agglomerated into islands and separated from each other. The heat conductive elements are disposed on the partial surface of the wick structure. The heat conductive fluid is disposed in the closed chamber. An electronic device including the heat conductive device is also provided. The heat conductive device has a good heat conductive efficiency.

12 Claims, 4 Drawing Sheets

(56) References Cited

U.S. PATENT DOCUMENTS

| | | | |
|---|---|---|---|
| 2011/0146955 A1* | 6/2011 | Chen | B22F 7/08 |
| | | | 165/104.26 |
| 2014/0060780 A1* | 3/2014 | Moon | F28D 15/046 |
| | | | 165/104.21 |
| 2014/0076995 A1* | 3/2014 | Wang | G06F 1/20 |
| | | | 239/145 |
| 2014/0182819 A1* | 7/2014 | Yang | F28D 15/04 |
| | | | 165/104.26 |
| 2017/0010048 A1* | 1/2017 | Wang | F28D 15/0233 |
| 2017/0338167 A1* | 11/2017 | Bozorgi | F28F 21/086 |
| 2018/0033007 A1* | 2/2018 | Chen | G06Q 20/4014 |
| 2019/0033007 A1* | 1/2019 | Wu | H01L 23/373 |
| 2020/0031677 A1* | 1/2020 | Zhamu | C09K 5/14 |

* cited by examiner

HEAT CONDUCTIVE DEVICE AND ELECTRONIC DEVICE

CROSS REFERENCE TO RELATED APPLICATIONS

This Non-provisional application claims priority under 35 U.S.C. § 119(a) on Patent Application No(s). 109103986 filed in Taiwan, Republic of China on Feb. 10, 2020, the entire contents of which are hereby incorporated by reference.

BACKGROUND

Technology Field

The present disclosure relates to a heat conductive device and, in particular, to a heat conductive device with a better heat conductive efficiency and an electronic device comprising the heat conductive device.

Description of Related Art

In recent years, the manufacturing processes and technologies for display components or electronic devices (e.g. mobile phones, tablets, notebook computers, or servers) have become more mature, and the degree of integration of their components has become higher and higher. Accordingly, the heat dissipation function has become the indispensable function for these components or devices. Especially for high-power components, since the heat energy generated during operation is sufficiently increased, if the heat energy generated by the heat source is not properly dissipated away, the temperature of the electronic device will rise rapidly. When the electronic device is subjected to an excessively high temperature, it may cause the permanent damage to the components or sufficiently reduce the lifetime of the electronic device.

Therefore, it is desired to provide a heat dissipating structure or a heat conductive structure, which is more suitable for the requirement of the electronic device, thereby obtaining a better heat dissipating or heat conductive efficiency.

SUMMARY

An objective of this disclosure is to provide a heat conductive device and an electronic device comprising the heat conductive device, which have a higher heat conductive efficiency for rapidly transferring and dissipating the heat energy generated by the heat source to the environment.

To achieve the above, this disclosure provides a heat conductive device, which comprises a heat conductive unit, a wick structure, a heat transferring unit, and a heat conductive fluid. The heat conductive unit comprises a closed chamber. The wick structure is disposed on an inner side surface of the closed chamber. The heat transferring unit comprises a plurality of heat conductive elements agglomerated into islands and separated from each other. The heat conductive elements are disposed on a partial surface of the wick structure. The heat conductive fluid is disposed in the closed chamber.

In one embodiment, the heat conductive unit is formed by two metal plates, and the wick structure is disposed on opposite surfaces of the two metal plates.

In one embodiment, the heat conductive device further comprises a partition member disposed between the two metal plates.

In one embodiment, a part of the heat conductive elements are further disposed on a partial surface of the partition member.

In one embodiment, the heat conductive unit is a tubular body, and the wick structure is disposed on an inner side surface of the tubular body.

In one embodiment, a surface coverage rate of the wick structure covered by the heat conductive elements ranges from 0.05% to 75%.

In one embodiment, a material of the heat conductive element comprises graphene, carbon nanotubes, or a combination thereof.

In one embodiment, when the heat conductive element is made of carbon nanotubes, an axis direction of the carbon nanotube is perpendicular to or parallel to a surface of the wick structure.

In one embodiment, when the heat conductive element is made of carbon nanotubes and graphene microchips, an axis direction of the carbon nanotube is perpendicular to or parallel to a surface of the graphene microchip.

To achieve the above, this disclosure also provides an electronic device, which comprises a heat source and the heat conductive device as mentioned above. One end of the heat conductive device contacts the heat source.

As mentioned above, in the heat conductive device and the electronic device of this disclosure, a plurality of heat conductive elements are located on a partial surface of the wick structure and are agglomerated into islands and separated from each other. This configuration can enhance the function of transferring the heat energy laterally for the heat conductive fluid, and increase the heat conductive efficiency of the wick structure, so that the temperature uniform effect and the heat conductive effect of the heat conductive device are better. Therefore, the heat conductive device of the present disclosure can have a higher heat conductive efficiency, and can rapidly transfer and dissipate the heat energy generated by the heat source of the electronic device to the environment.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

The present disclosure will be apparent from the following detailed description, which proceeds with reference to the accompanying drawings, wherein the same references relate to the same elements.

The heat conduction device of the present disclosure can have a higher heat conductive efficiency, and can rapidly transfer and dissipate the heat energy generated by the heat source to the environment, so that it is suitable for the heat dissipation requirements of electronic devices (or mobile devices). The heat conductive device can be disposed inside the electronic device, and one end of the heat conductive device may contact the heat source to transfer the heat energy generated by the heat source to the other end through the heat conductive device, so as to avoid the electronic device from being crashed or burned due to the high temperature of the heat source. In some embodiments, the heat source may include, for example but not limited to, a central processing unit (CPU), a memory chip (card), a display chip (card), a panel, a power element, or other devices, units or components that generate high-temperature heat energy. In addition, the aforementioned electronic device may be, for example but not limited to, a mobile phone, a computer (a tablet, a desktop computer, or a notebook computer), a television, a display-related mobile electronic device, or an electronic device or mobile device in other fields.

The heat conductive device of this disclosure may be a vapor chamber or a heat pipe. The heat pipe is a circular pipe, and the heat transferring method thereof is a one-dimensional and linear heat transferring method. The vapor chamber provides a two-dimensional and surface heat transferring method, which is a high performance heat dissipating device that can quickly transfer the heat from a local heat source to the other side of the vapor chamber. Accordingly, the vapor chamber is a better solution for the heat dissipation issue with more severe conditions and can provide higher heat conductive or heat dissipation efficiencies.

Figure 1A:
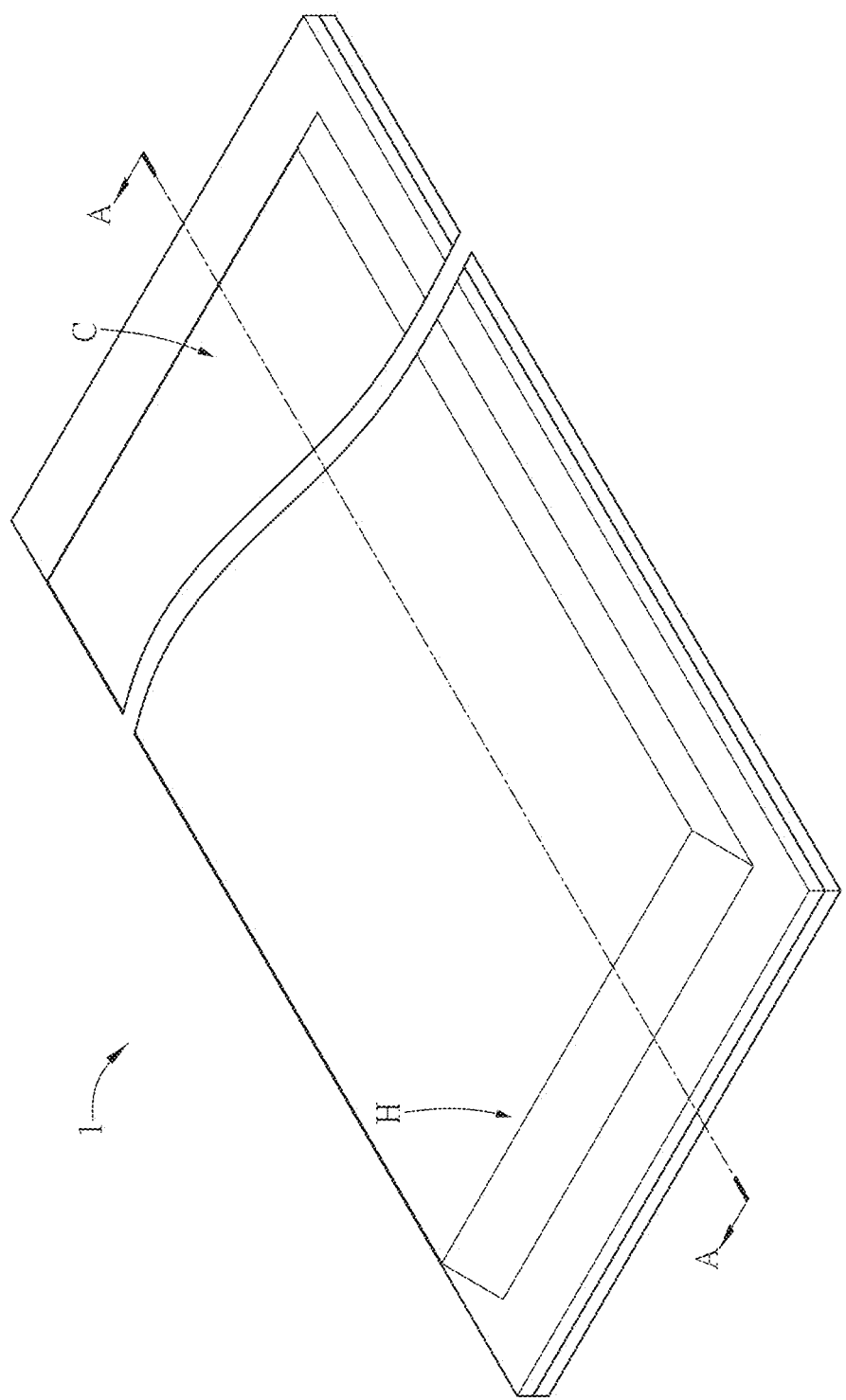
FIG. 1A is a schematic diagram showing a heat conductive device according to an embodiment of this disclosure.
Figure 1B:
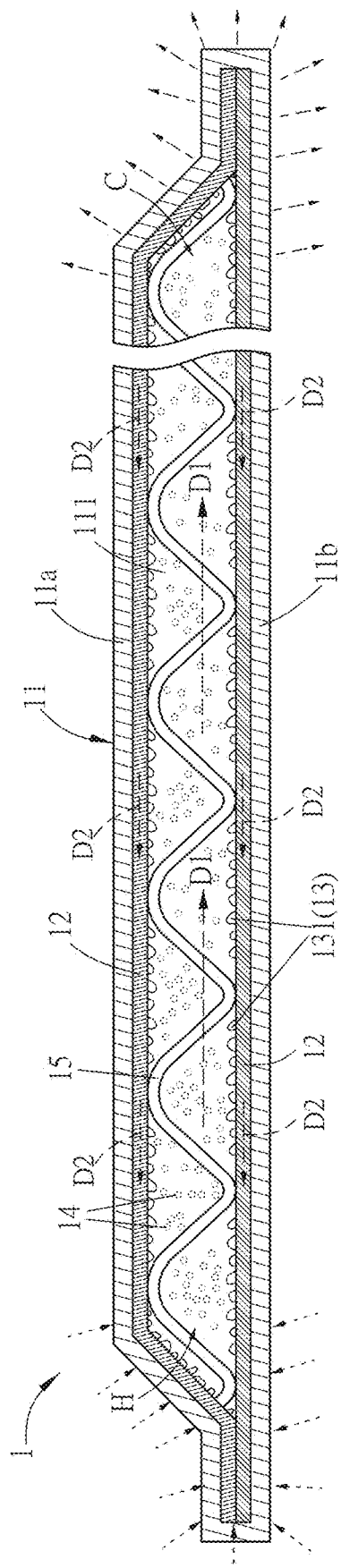
FIG. 1B is a sectional view of the heat conductive device of FIG. 1A along the line A-A.

FIG. 1A is a schematic diagram showing a heat conductive device according to an embodiment of this disclosure, and FIG. 1B is a sectional view of the heat conductive device of FIG. 1A along the line A-A. To be noted, in order to describe the internal structure of the heat conductive device, the lengths, shapes or sizes of the components shown in FIGS. 1A and 1B are for illustrations only. In practice, the heat conductive device can be curved in the horizontal direction and/or the vertical direction, and the curved method can be determined based on the internal space of the applied electronic device or mobile device.

As shown in FIGS. 1A and 1B, the heat conductive device 1 comprises a heat conductive unit 11, a wick structure 12, a heat transferring unit 13, and a heat conductive fluid 14.

The heat conductive unit 11 forms a closed chamber 111. In this embodiment, the heat conductive device 1 is a vapor chamber, which is suitable for the heat conduction and heat dissipation of the thin electronic device or mobile device. The heat conductive unit 11 has two opposite ends, including a heat source end H (or heat source side) and a cooling end C (or cooling side). The heat source end H (or heat source side) is one end (side) of the heat conductive unit 11 close to the heat source, and the cooling end C (or cooling side) is one end (side) of the heat conductive unit 11 away from the heat source. The heated portion of the closed chamber 111 of the heat conductive unit 11 is defined as an evaporation zone, and the other side thereof opposite to the evaporation zone is defined as a condensing zone. The heat conductive fluid 14 can absorb the heat energy in the evaporation zone and then be evaporated, and the evaporated heat conductive fluid 14 can quickly expand to occupy the entire closed chamber 111. Afterwards, the evaporated heat conductive fluid 14 will be condensed in the condensing zone to form the liquid heat conductive fluid 14 with releasing the heat energy. Then, the liquid heat conductive fluid 14 will flow back to the evaporation zone. The cycles of the evaporation and condensing of the heat conductive fluid 14 can implement the rapid transferring of the heat energy.

The heat conductive unit 11 has a strong structure for bearing the pressure difference between the internal pressure and the external pressure, which is made by the intermediate material for conducting heat in and out. Preferably, the material of the heat conductive unit 11 comprises metal (high thermal conductive metal material) such as, for example but not limited to, copper, aluminum, iron, silver, and gold. In this embodiment, the heat conductive unit 11 is formed by connecting two opposite metal plates 11a and 11b. The metal plates 11a and 11b can be connected by, for example, welding. The meal plate 11a is sank toward the upper side and is connected to the planar metal plate 11b to form the closed chamber 111. In this embodiment, for example, the material of the metal plates 11a and 11b is copper.

The wick structure 12 is disposed on the inner side surface of the closed chamber 111. In this embodiment, the wick structure 12 is disposed on the opposite surfaces of the two metal plates 11a and 11b. The wick structure 12 can be a metal net, metal particles, metal powder, or metal nanoparticles, and is made of a high heat conductive metal material such as copper, aluminum, silver, gold, or the likes. The wick structure 12 may have different designs, and the common designs comprises the groove type, mesh type (woven), fiber type and sintered type. The wick structure 12 is preferably a sintered type wick structure. The main reason is that if the sintered type wick structure is used, no matter what angle the heat conductive unit 11 is placed in, the condensed heat conductive fluid 14 can reflow through the wick structure 12 without any problems. The wick structure in any of other designs is still limited in orientation and angle. Since the inner side surface of the heat conductive unit 11 is configured with the wick structure 12, the liquid heat conductive fluid 14, which is condensed from the gaseous heat conductive fluid 14 after dissipating the carried heat energy to the environment in the cooling zone (cooling end C), can reflow to the evaporation zone (heat source end H) of the heat conductive unit 11 (the flow direction D2) through the wick structure 12. Thus, the heat conductive fluid 14 can be continuously circulated inside the heat conductive unit 11. In this embodiment, the material of the wick structure 12 is copper and is, for example, a sintered type wick structure.

The heat transferring unit 13 comprises a plurality of heat conductive elements 131, which are agglomerate into islands and separated from each other, and the heat conductive elements 131 are disposed on a partial surface of the wick structure 12. In this embodiment, the sizes and shapes of the agglomerated islands formed by the heat conductive elements 131 are not limited only if a partial surface of the wick structure 12 can be covered by the heat conductive elements 131. Each of the heat conductive elements 131 comprises high heat conductive material such as, for example but not limited to, graphene, carbon nanotubes, or a combination thereof. In this embodiment, the heat conductive element 131 is made of graphene microchips. Since the graphene (heat transferring unit 13) has good heat conductivity in the xy plane, it can cover the partial surface of the wick structure 12 for enhancing the lateral heat transferring ability of the heat conductive fluid 14 and increasing the heat conductive efficiency of the wick structure 12.

In this embodiment, the surface coverage rate of the wick structure 12 covered by the heat conductive elements 131 ranges from 0.05% to 75% (0.05%≤the surface coverage rate≤75%). Preferably, the surface coverage rate of the wick structure 12 covered by the heat conductive elements 131 is, for example, 10%. In this example, the heat conductive efficiency is better. To be noted, the surface coverage rate of the wick structure 12 cannot be 100%. In other words, if the heat transferring unit 13 covers the entire surface of the wick structure 12, the heat conductive efficiency of the wick structure 12 is decreased.

In different embodiments, when the heat conductive elements, which cover the partial surface of the wick structure 12, are made of carbon nanotubes, the axis directions of the carbon nanotubes can be perpendicular to or parallel to the surface of the wick structure 12. Alternatively, when the heat conductive elements 131 are made of carbon nanotubes and graphene microchips, the axis directions of the carbon nanotubes can be perpendicular to or parallel to the surface of the graphene microchips. In practice, the growing directions of the carbon nanotubes can be controlled by the manufacturing conditions, so that the axis directions of the grown carbon nanotubes can be perpendicular to or parallel to the surface of the wick structure 12, or be perpendicular to or parallel to the surface of the graphene microchips. This configuration can increase the flowing rates of the heat conductive fluid 14 entering and existing the wick structure 12, thereby increasing the heat conductive efficiency. When the axis directions of the carbon nanotubes are perpendicular to the surface of the graphene microchips, the three-dimensional composite structure can be formed. In this case, the carbon nanotubes can form the three-dimensional obstacle so as to effectively separate individual graphene microchips and thus to avoid re-agglomeration. Moreover, the excellent properties of carbon nanotubes can further enhance the heat conductive performance of the graphene microchips.

The heat conductive fluid 14 is filled and disposed in the closed chamber 111 of the heat conductive unit 11. Since the heat source end H of the heat conductive device 1 contacts the heat source, the heat energy generated by the heat source can be transferred to the heat source end H of the heat conductive unit 11 (see the arrow shown in FIG. 1B). Accordingly, the temperature of the heat source end H increases so as to evaporate the heat conductive fluid 14 at the heat source end H to the gaseous state. Optionally, the heat conductive fluid 14 can be a refrigerant or any of other heat conductive fluids such as, for example but not limited to, Freon, ammonia, acetone, methanol, ethylene glycol, propylene glycol, water, or the likes. The heat conductive fluid 14 can be optionally selected depending on the type, temperature or model of the heat source of the electronic device (or mobile device) as long as the selected heat conductive fluid 14 can be vaporized into the gaseous state at the heat source end H by the temperature of the heat source and be condensed and refluxed at the cooling end C.

To be noted, when the refrigerant is selected as the heat conductive fluid 14, the closed chamber 111 must be vacuumed before injecting the refrigerant into the heat conductive unit 11. This is because that the impure gas (e.g. air) does not participate in the vaporization-condensation cycle of the heat conductive fluid 14 inside the heat conductive unit 11 and thus is called as the non-condensable gas. The non-condensable gas may increase the vaporization temperature, and also occupy a certain volume of space in the heat conductive unit 11 when the heat conductive device 1 is in operation, which can affect the heat conductive efficiency of the heat conductive device 1.

In addition, the hat conductive device 1 further comprises a partition member 15. The partition member 15 can be disposed between the two metal plates 11a and 11b, so that a certain gap can be remained between the metal plates 11a and 11b. This configuration can keep the structure and shape of the heat conductive device 1. The material of the partition member 15 can be the same as or different from that of the heat conductive unit 11 or the wick structure 12. In this embodiment, the material of the partition member 15 is the same as that of the metal plates 11a and 11b, and the partition member 15 has a net shape.

The heat conductive device 1 and the heat source can be connected through, for example but not limited to, a heat conductive paste or a heat dissipation paste. Accordingly, when the heat source and the heat source end H of the heat conductive device 1 are connected through a heat conductive paste or a heat dissipation paste, the heat energy generated by the heat source can be transferred to the heat source end H of the heat conductive device 1. In some embodiments, the material of the heat conductive paste or heat dissipation paste may include an acrylic material.

As mentioned above, when the heat conductive device 1 contacts the heat source, the temperature of the heat source end H of the heat conductive unit 11 can be increased, thereby vaporizing the heat conductive fluid 14 at the heat source end H into the gas state. Then, the gaseous heat conductive fluid 14 flows along a flow path (the flow direction D1) inside the closed chamber 111 toward the cooling end C. Thus, the heat energy generated by the heat source can be carried away the heat source end H through the heat conductive fluid 14. After reaching the cooling end C, the heat conductive fluid 14 can dissipate the carried heat energy outside the heat conductive unit 11 (shown by the arrow away from the cooling end C). Since the inner side surface of the heat conductive unit 11 is configured with the wick structure 12, the condensed liquid heat conductive fluid 14 can flow to the heat source end H (the flow direction D2) through the wick structure 12. Accordingly, the heat conductive fluid 14 can be continuously circulated inside the heat conductive unit 11 for continuously carrying the heat energy of the heat source away and dissipating the heat energy at the cooling end C, thereby decreasing the temperature of the heat source.

In this embodiment, the heat transferring unit 13 comprises a plurality of heat conductive elements 131, which are agglomerate into islands and separated from each other, and the heat conductive elements 131 are disposed on a partial surface of the wick structure 12. This configuration can enhance the lateral heat transferring ability of the heat conductive fluid 14 and thus make the liquid heat conductive fluid 14 flow back the heat source end H along the flow direction D2 rapidly, thereby increasing the heat circulation efficiency of the heat conductive fluid 14. Thus, the heat conductive device 1 can have better effects in temperature uniform and heat transfer. Compared with the conventional vapor chamber structure, which does not include the heat transferring unit 13, the heat conductive device 1 of this embodiment can efficiently and rapidly transfer the heat energy from the heat source end H to the cooling end C and then dissipate the heat energy to environment, so that the temperature uniform effect and heat conductive efficiency of the heat conductive device 1 of this embodiment are better than those of the conventional vapor chamber.

Figure 1C:
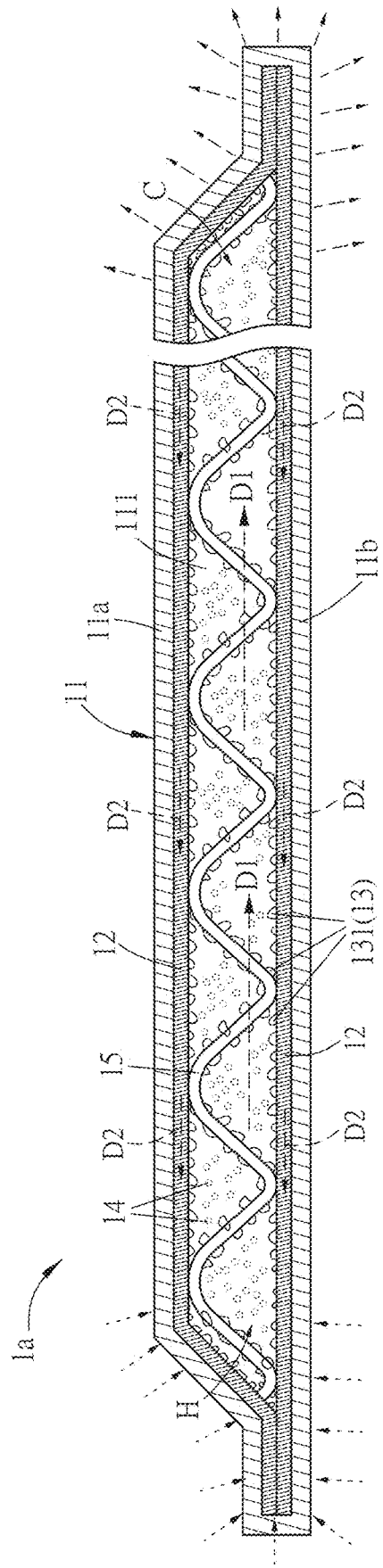
FIG. 1C is a sectional view of the heat conductive device according to another embodiment of this disclosure.

FIG. 1C is a sectional view of the heat conductive device according to another embodiment of this disclosure.

The heat conductive device 1a of FIG. 1C is mostly the same as the heat conductive device 1 of FIG. 1B. Different from the heat conductive device 1 of FIG. 1B, in the heat conductive device 1*a* of FIG. 1C, a part of the heat conductive elements 131 are further disposed on a partial surface of the partition member 15. This configuration can further increase the lateral transferring of the heat energy.

Figure 2A:
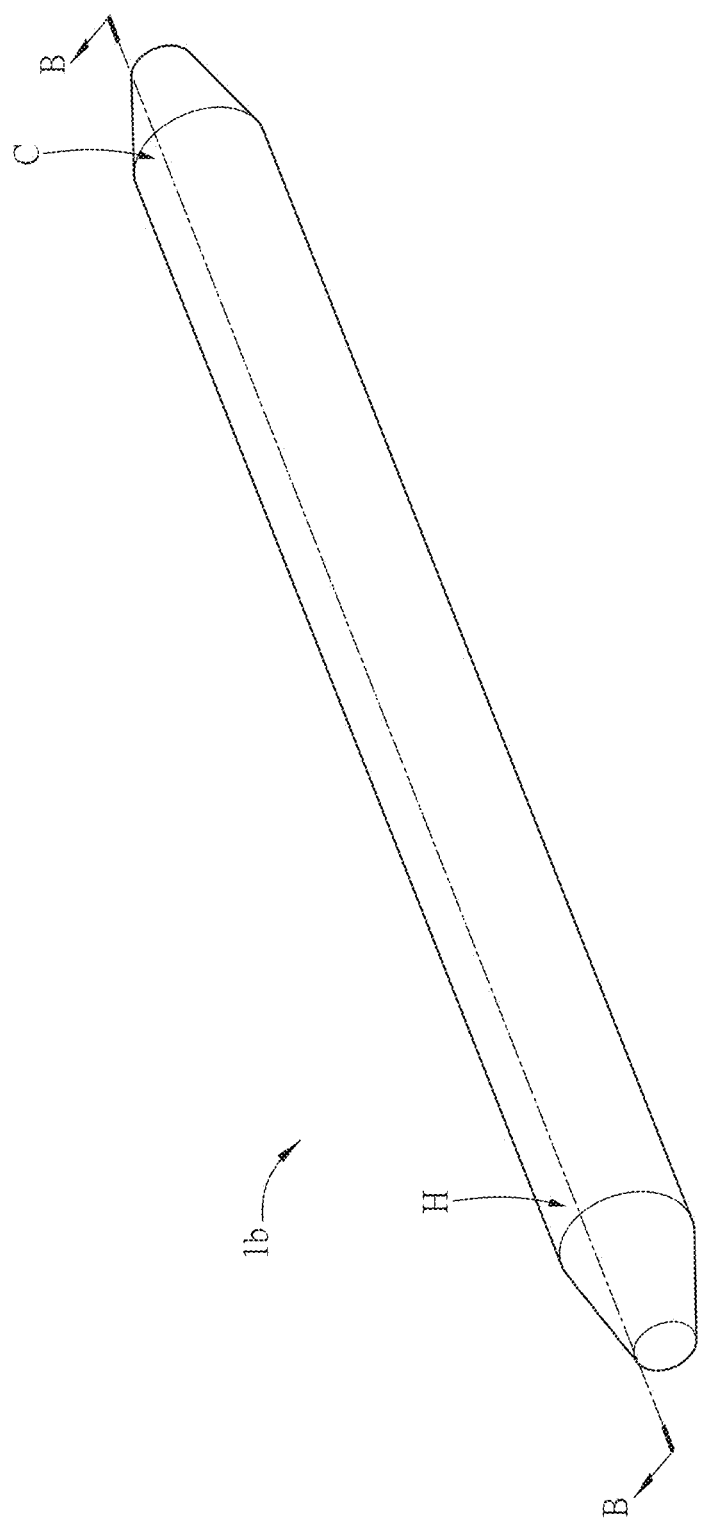
FIG. 2A is a schematic diagram showing a heat conductive device according to another embodiment of this disclosure.
Figure 2B:
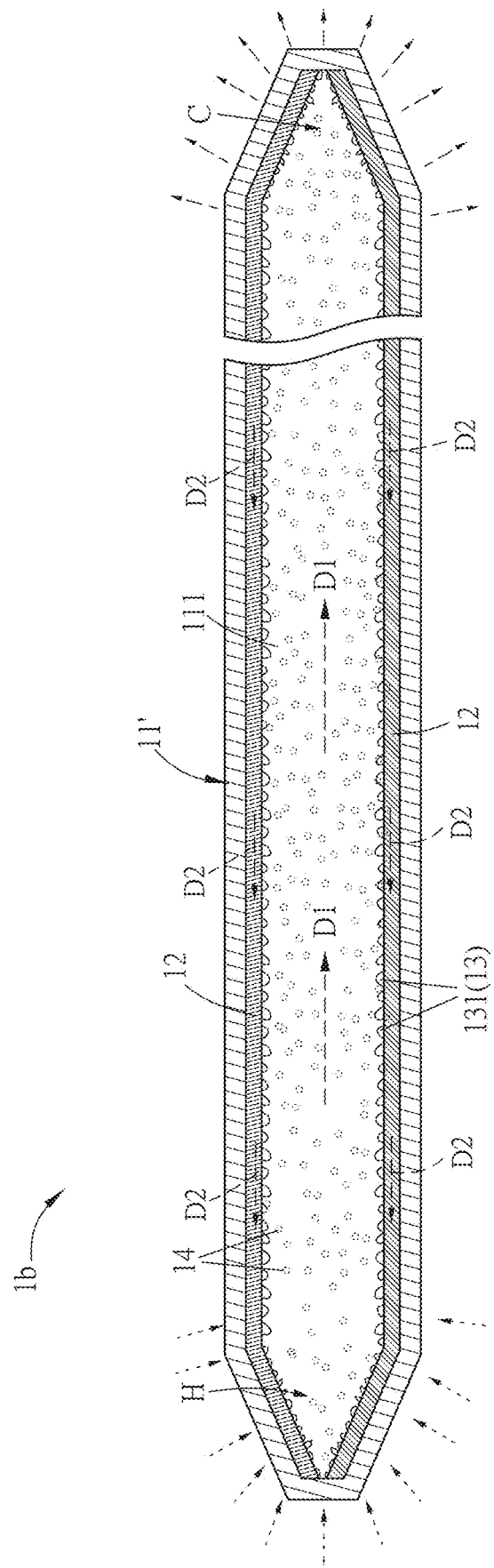
FIG. 2B is a sectional view of the heat conductive device of FIG. 2A along the line B-B.

FIG. 2A is a schematic diagram showing a heat conductive device according to another embodiment of this disclosure, and FIG. 2B is a sectional view of the heat conductive device of FIG. 2A along the line B-B.

The heat conductive device 1*b* of FIGS. 2A and 2B is mostly the same as the heat conductive device 1 of FIG. 1B. Different from the heat conductive device 1 of FIG. 1B, the heat conductive unit 11' of the heat conductive device 1*b* of this embodiment includes a tubular body, and the wick structure 12 is disposed on an inner side surface of the tubular body. The other technical features of the heat conductive devices 1*a* and 1*b* can be referred to the same components of the heat conductive device 1, so the detailed descriptions thereof will be omitted.

This disclosure also provides an electronic device, which comprises a heat source and one of the above-mentioned heat conductive devices 1, 1*a* and 1*b* and any modifications thereof. The electronic device can be a mobile device or a stationary device. The specific technical contents thereof can be referred to the above embodiments, so the detailed descriptions thereof will be omitted. In this embodiment, the heat source end of the heat conductive device contacts and thus connects to the heat source. The electronic device can be a mobile phone, a computer, a television, a display-related mobile or stationary electronic device, or an electronic device in other fields. The heat source of the electronic device can be a central processing unit (CPU), a memory chip (card), a display chip (card), a panel, a power element, or other devices, units or components that generate high-temperature heat energy. This disclosure is not limited thereto.

In summary, in the heat conductive device and the electronic device of this disclosure, a plurality of heat conductive elements are located on a partial surface of the wick structure and are agglomerated into islands and separated from each other. This configuration can enhance the function of transferring the heat energy laterally for the heat conductive fluid, and increase the heat conductive efficiency of the wick structure, so that the temperature uniform effect and the heat conductive effect of the heat conductive device are better. Therefore, the heat conductive device of the present disclosure can have a higher heat conductive efficiency, and can rapidly transfer and dissipate the heat energy generated by the heat source of the electronic device to the environment.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A heat conductive device, comprising:
a heat conductive unit comprising a closed chamber and formed by two metal plates;
a wick structure disposed on an inner side surface of the closed chamber, wherein the wick structure is disposed on opposite surfaces of the two metal plates;
a heat transferring unit comprising a plurality of heat conductive elements agglomerated into islands and separated from each other, wherein the heat conductive elements are disposed on a partial surface of the wick structure;
a heat conductive fluid disposed in the closed chamber; and
a partition member disposed between the two metal plates, wherein a part of the heat conductive elements are further disposed on a partial surface of the partition member.

2. The heat conductive device of claim 1, wherein the heat conductive unit comprises a tubular body, and the wick structure is disposed on an inner side surface of the tubular body.

3. The heat conductive device of claim 1, wherein a surface coverage rate of the wick structure covered by the heat conductive elements ranges from 0.05% to 75%.

4. The heat conductive device of claim 1, wherein a material of the heat conductive element comprises graphene, carbon nanotubes, or a combination thereof.

5. The heat conductive device of claim 1, wherein when the heat conductive element is made of carbon nanotubes, an axis direction of the carbon nanotube is perpendicular to or parallel to a surface of the wick structure.

6. The heat conductive device of claim 1, wherein when the heat conductive element is made of carbon nanotubes and graphene microchips, an axis direction of the carbon nanotube is perpendicular to or parallel to a surface of the graphene microchip.

7. An electronic device, comprising:
a heat source; and
a heat conductive device, wherein one end of the heat conductive device contacts the heat source, and the heat conductive device comprises:
a heat conductive unit comprising a closed chamber and formed by two metal plates;
a wick structure disposed on an inner side surface of the closed chamber, wherein the wick structure is disposed on opposite surfaces of the two metal plates;
a heat transferring unit comprising a plurality of heat conductive elements agglomerated into islands and separated from each other, wherein the heat conductive elements are disposed on a partial surface of the wick structure;
a heat conductive fluid disposed in the closed chamber, and
a partition member disposed between the two metal plates, wherein a part of the heat conductive elements are further disposed on a partial surface of the partition member.

8. The electronic device of claim 7, wherein the heat conductive unit is a tubular body, and the wick structure is disposed on an inner side surface of the tubular body.

9. The electronic device of claim 7, wherein a surface coverage rate of the wick structure covered by the heat conductive elements ranges from 0.05% to 75%.

10. The electronic device of claim 7, wherein a material of the heat conductive element comprises graphene, carbon nanotubes, or a combination thereof.

11. The electronic device of claim 7, wherein when the heat conductive element is made of carbon nanotubes, an axis direction of the carbon nanotube is perpendicular to or parallel to a surface of the wick structure.

12. The electronic device of claim 7, wherein when the heat conductive element is made of carbon nanotubes and graphene microchips, an axis direction of the carbon nanotube is perpendicular to or parallel to a surface of the graphene microchip.

\* \* \* \* \*